(12) United States Patent
Iwahori

(10) Patent No.: US 10,777,579 B2
(45) Date of Patent: Sep. 15, 2020

(54) SEMICONDUCTOR INTEGRATED CIRCUIT DEVICE

(71) Applicant: SOCIONEXT INC., Kanagawa (JP)

(72) Inventor: Junji Iwahori, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/543,220

(22) Filed: Aug. 16, 2019

(65) Prior Publication Data

US 2019/0371819 A1 Dec. 5, 2019

Related U.S. Application Data

(63) Continuation of application No. PCT/JP2018/003636, filed on Feb. 2, 2018.

(30) Foreign Application Priority Data

Feb. 16, 2017 (JP) .................................. 2017-026851

(51) Int. Cl.
*H01L 27/118* (2006.01)
*H01L 29/06* (2006.01)
(Continued)

(52) U.S. Cl.
CPC .... *H01L 27/11807* (2013.01); *H01L 29/0673* (2013.01); *H01L 29/785* (2013.01);
(Continued)

(58) Field of Classification Search
CPC ........... H01L 27/11807; H01L 27/0924; H01L 27/092; H01L 27/088; H01L 27/04;
(Continued)

(56) References Cited

U.S. PATENT DOCUMENTS

2010/0155783 A1\* 6/2010 Law .................... H01L 27/0207
257/206
2010/0287518 A1\* 11/2010 Becker .................. H01L 27/092
716/123
(Continued)

FOREIGN PATENT DOCUMENTS

JP 2003-060487 A 2/2003
JP 2008-263185 A 10/2008
(Continued)

OTHER PUBLICATIONS

International Search Report and Written Opinion issued in International Patent Application No. PCT/JP2018/003636, dated Apr. 17, 2018; with English translation.

*Primary Examiner* — Galina G Yushina
(74) *Attorney, Agent, or Firm* — McDermott Will & Emery LLP

(57) ABSTRACT

In a semiconductor integrated circuit device using three-dimensional transistor devices, a delay cell having a large delay value per unit area is implemented. A first cell, which is a logic cell, includes three-dimensional transistor devices. A second cell, which is a delay cell, includes three-dimensional transistor devices. The length by which a second local interconnect protrudes from a second solid diffusion layer portion in a direction away from a power supply interconnect in the second cell is greater than the length by which a first local interconnect protrudes from a first solid diffusion layer portion in a direction away from the power supply interconnect in the first cell.

17 Claims, 10 Drawing Sheets

(51) Int. Cl.
*H01L 29/78* (2006.01)
*H01L 29/786* (2006.01)

(52) U.S. Cl.
CPC .................. *H01L 29/78696* (2013.01); *H01L 2027/11825* (2013.01); *H01L 2027/11875* (2013.01); *H01L 2027/11881* (2013.01)

(58) Field of Classification Search
CPC ........... H01L 27/0207; H01L 27/00218; H01L 27/0688; H01L 27/0886; H01L 29/78696; H01L 29/785; H01L 29/0637; H01L 29/66439; H01L 2027/11881; H01L 2027/11875; H01L 21/8238; H01L 21/822; H01L 21/82
See application file for complete search history.

(56) References Cited

U.S. PATENT DOCUMENTS

| | | | |
|---|---|---|---|
| 2011/0204477 A1* | 8/2011 | Wada | H01L 23/5223 257/532 |
| 2013/0027083 A1* | 1/2013 | Ando | H01L 27/0207 326/102 |
| 2013/0193986 A1* | 8/2013 | Willey | G11C 29/023 324/617 |
| 2016/0049395 A1 | 2/2016 | Okagaki et al. | |
| 2016/0190138 A1* | 6/2016 | Shimbo | H01L 27/0629 257/369 |
| 2018/0090514 A1* | 3/2018 | Datta | G06F 17/5054 |

FOREIGN PATENT DOCUMENTS

| | | |
|---|---|---|
| JP | 2016-042568 A | 3/2016 |
| JP | 2016-063061 A | 4/2016 |
| WO | 2015/033490 A1 | 3/2015 |

\* cited by examiner

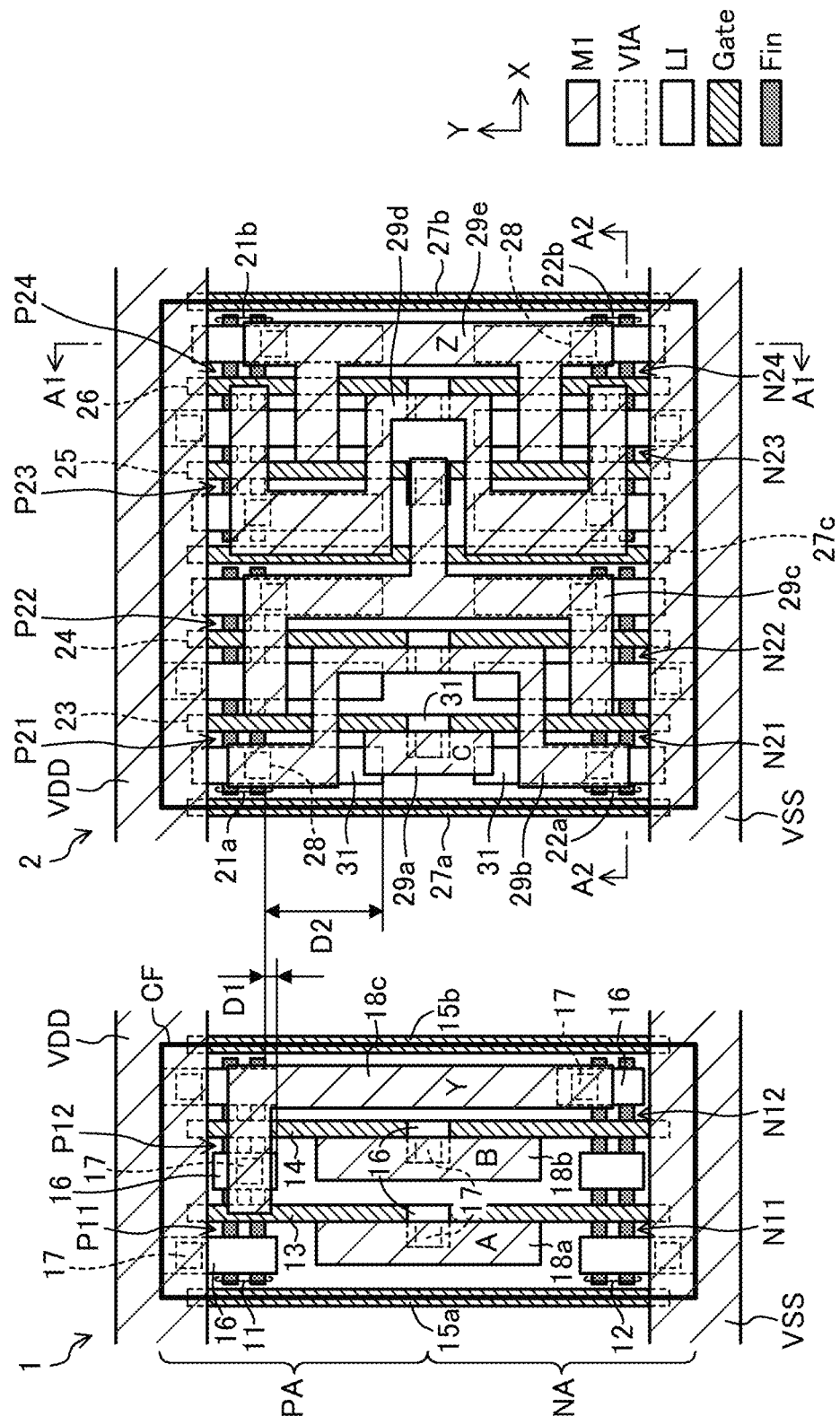

SEMICONDUCTOR INTEGRATED CIRCUIT DEVICE

CROSS-REFERENCE TO RELATED APPLICATIONS

This is a continuation of International Application No. PCT/JP2018/003636 filed on Feb. 2, 2018, which claims priority to Japanese Patent Application No. 2017-026851 filed on Feb. 16, 2017. The entire disclosures of these applications are incorporated by reference herein.

BACKGROUND

The present disclosure relates to a semiconductor integrated circuit device using three-dimensional transistor devices such as fin field effect transistors (FETs) and nanowire FETs.

As a method for forming a semiconductor integrated circuit on a semiconductor substrate, the standard cell method is known. In the standard cell method, basic units having specific logical functions (e.g., an inverter, a latch, a flipflop, and a full adder) are prepared in advance as standard cells. A plurality of such standard cells are placed on a semiconductor substrate and connected to each other via interconnects, whereby an LSI chip is designed.

In recent years, use of FETs having a fin structure (hereinafter referred to as fin FETs) has been proposed in the field of semiconductor devices. FIG. 9 is a diagrammatic view showing an outline of a fin FET. Unlike a FET having a two-dimensional structure, the source and drain of the fin FET have a raised solid structure called a fin. A gate is placed to surround the fin. Having such a fin structure, where the channel region is formed of three faces of the fin, the controllability of the channel greatly improves compared to that of conventional ones. This brings about effects such as reduction in leakage power, improvement of ON current, and reduction in operating voltage, thereby improving the performance of the semiconductor integrated circuit. The fin FET is one type of the so-called three-dimensional transistor device having a solid diffusion layer portion. As another type of the three-dimensional transistor device, there is a structure called a nanowire FET, for example.

A delay cell is used for timing adjustment of circuit operation, etc. and implemented using a buffer, for example. Japanese Unexamined Patent Publication No. 2003-60487 describes examples of such a delay adjustment cell.

SUMMARY

In implementation of a three-dimensional transistor device, a local interconnect is normally used. The local interconnect refers to an interconnect provided to have direct contact with the diffusion layer and gate of the transistor, not via a contact.

In a semiconductor integrated circuit device using such local interconnects, how to implement a delay cell having a large delay value per unit area is a problem to be addressed.

The present disclosure implements a delay cell having a large delay value per unit area in a semiconductor integrated circuit device using three-dimensional transistor devices such as fin FETs and nanowire FETs.

According to the first form of the present disclosure, the semiconductor integrated circuit device includes: a first standard cell, which is a logic cell, having three-dimensional transistor devices; and a second standard cell, which is a delay cell, having three-dimensional transistor devices. The first standard cell includes: a plurality of first solid diffusion layer portions extending in a first direction, the plurality of first solid diffusion layer portions being arranged in a second direction vertical to the first direction; and a first local interconnect extending in the second direction and connecting the plurality of first solid diffusion layer portions and a power supply interconnect extending in the first direction to feed a predetermined first power supply voltage. The second standard cell includes: a plurality of second solid diffusion layer portions extending in the first direction, the plurality of second solid diffusion layer portions being arranged in the second direction; a second local interconnect extending in the second direction and connecting the plurality of second solid diffusion layer portions and the power supply interconnect; and a gate interconnect extending in the second direction to intersect with the plurality of second solid diffusion layer portions as viewed from top, formed to surround the plurality of second solid diffusion layer portions, a signal being applied to the gate interconnect. The length by which the second local interconnect protrudes from the plurality of second solid diffusion layer portions in a direction away from the power supply interconnect in the second standard cell is greater than the length by which the first local interconnect protrudes from the plurality of first solid diffusion layer portions in a direction away from the power supply interconnect in the first standard cell.

In the form described above, the length by which the local interconnect protrudes from the solid diffusion layer portion in a direction away from the power supply interconnect in the second standard cell that is a delay cell is greater than the length by which the local interconnect protrudes from the solid diffusion layer portion in a direction away from the power supply interconnect in the first standard cell that is a logic cell. That is, in the delay cell, the local interconnect connected to the solid diffusion layer portion of each three-dimensional transistor device extends long from the solid diffusion layer portion. This makes the parasitic capacitance between the local interconnect and the gate interconnect larger, and thus a delay cell having a large delay value per unit area can be implemented.

According to the present disclosure, a delay cell having a large delay value per unit area can be implemented in a semiconductor integrated circuit device using three-dimensional transistor devices. Accordingly, the performance of the semiconductor integrated circuit device can be improved.

BRIEF DESCRIPTION OF THE DRAWINGS

FIG. 1 is a plan view showing a layout configuration example of standard cells provided in a semiconductor integrated circuit device of the first embodiment.

DETAILED DESCRIPTION

Embodiments of the present disclosure will be described hereinafter with reference to the accompanying drawings. In the following embodiments, assume that a semiconductor integrated circuit device has a plurality of standard cells, at least part of which uses a fin field effect transistor (FET). Note that the fin FET is an example of the three-dimensional transistor devices and the fin constituting the fin FET is an example of the solid diffusion layer portion.

First Embodiment

Figure 2A:
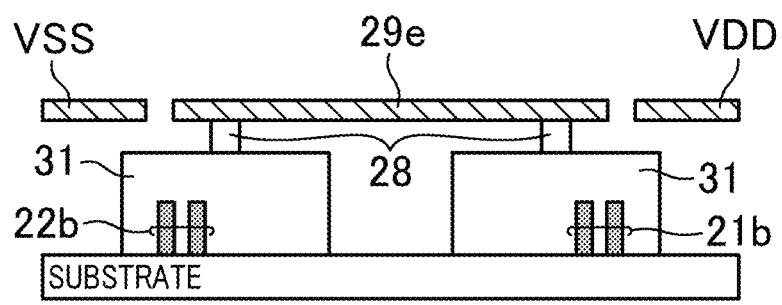
FIGS. 2A and 2B are cross-sectional views in the configuration of FIG. 1.
Figure 2B:
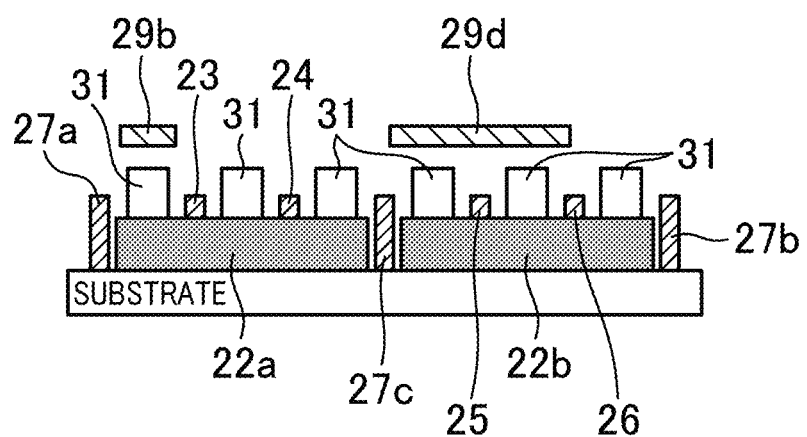

FIG. 1 is a plan view showing a layout configuration example of standard cells provided in a semiconductor integrated circuit device of the first embodiment. In FIG. 1, the lateral direction as viewed from the figure is referred to as the X direction (corresponding to the first direction), and the longitudinal direction as viewed from the figure is referred to as the Y direction (corresponding to the second direction). This also applies to the subsequent layout plan views. In FIG. 1, standard cells 1 and 2 are placed in the same cell row extending in the X direction. CF refers to the cell frame. FIG. 2A is a cross-sectional view taken along line A1-A1 in FIG. 1, and FIG. 2B is a cross-sectional view taken along line A2-A2 in FIG. 1.

Figure 3A:
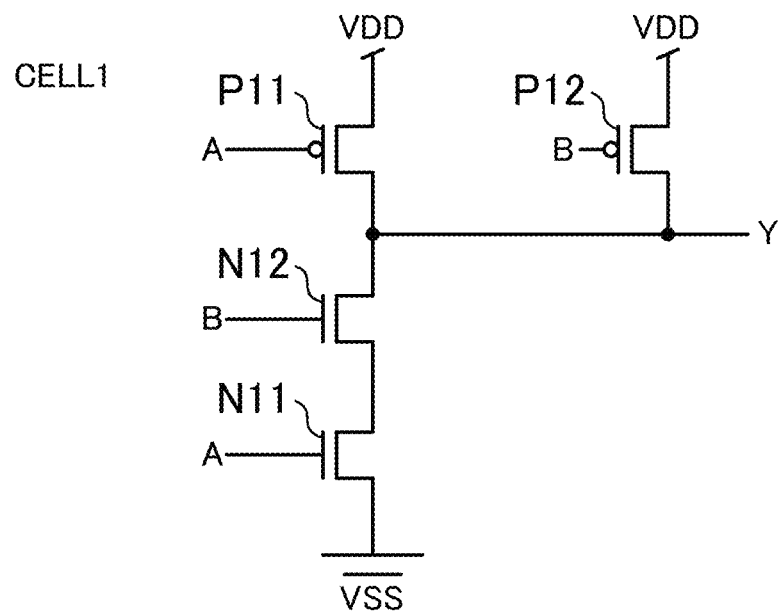
FIGS. 3A and 3B are circuit diagrams of the standard cells in FIG. 1.
Figure 3B:
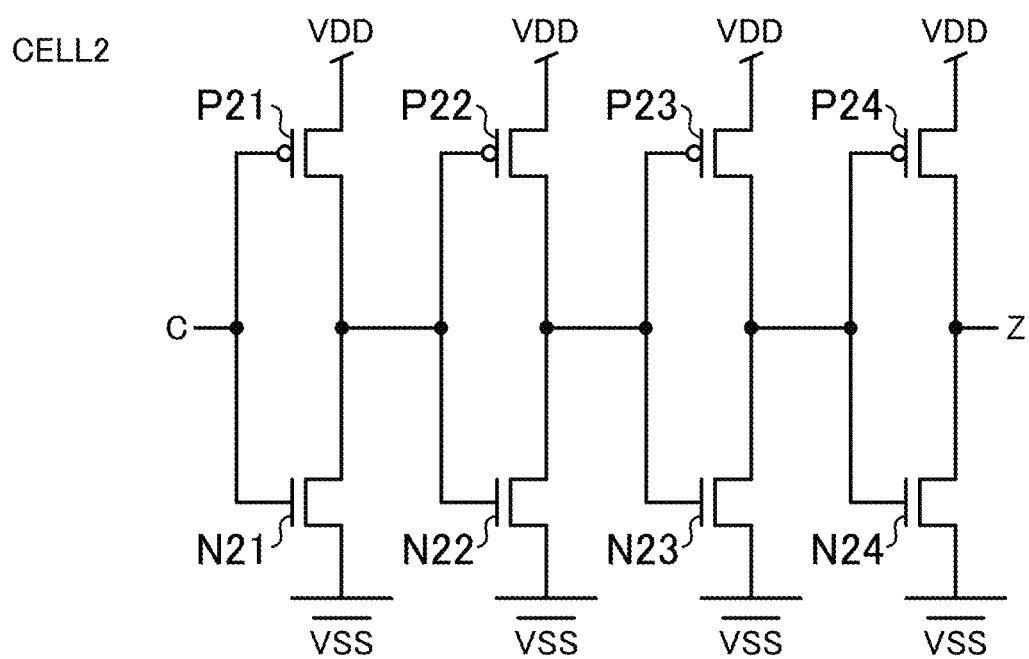

FIGS. 3A and 3B are circuit diagrams respectively showing the circuit configurations of the standard cells 1 and 2. As shown in FIG. 3A, the standard cell 1 constitutes a 2-input NAND circuit, and is an example of a logic cell contributing to the logical function of the circuit. As shown in FIG. 3B, the standard cell 2 constitutes a delay cell, which has four serially-connected inverters.

In FIG. 1, power supply interconnects VDD and VSS extending in the X direction are formed in a metal interconnect layer M 1. In the standard cells 1 and 2, a p-type transistor area PA and an n-type transistor area NA are placed side by side in the Y direction. The standard cell 1 includes two fins 11 extending in the X direction in the p-type transistor area PA and two fins 12 extending in the X direction in the n-type transistor area NA. The standard cell 2 includes two fins 21a extending in the X direction and two fins 21b extending in the X direction in the p-type transistor area PA, and two fins 22a extending in the X direction and two fins 22b extending in the X direction in the n-type transistor area NA. The fins 21a and 21b are placed in line with each other, and the fins 22a and 22b are placed in line with each other. In FIG. 1 and the other plan views, a fin FET is constituted by such a fin and a gate interconnect formed thereon. The gate interconnect is formed to cover the fin on three sides. Note that, in FIG. 1 and the other plan views, the fins are filled with gray color for better viewability of the drawings.

Local interconnects are provided in an interconnect layer LI that is in direct contact with the fin layer. The local interconnects are formed in contact with the top surfaces of the fins or the gate interconnects in portions overlapping the fins or the gate interconnects as viewed from top, to be electrically connected with the fins or the gate interconnects. Metal interconnects are located above the local interconnects and connected to the local interconnects via contacts.

The standard cell 1 includes gate interconnects 13 and 14 extending in the Y direction over the p-type transistor area PA and the n-type transistor area NA. The fins 11 and the gate interconnects 13 and 14 respectively constitute fin FETs P11 and P12. The fins 12 and the gate interconnects 13 and 14 respectively constitute fin FETs N11 and N12. Dummy gate interconnects 15a and 15b are also provided. Local interconnects 16 extending in the Y direction are provided at both ends of the fins 11 and 12 and between the gate interconnects 13 and 14. Both ends of the fins 11 are connected to the power supply interconnect VDD via the corresponding local interconnects 16 and contacts 17. Ends of the fins 12 (ends on the left side as viewed from the figure) are connected to the power supply interconnect VSS via the corresponding local interconnect 16 and contact 17. The gate interconnect 13 is connected, via the corresponding local interconnect 16 and contact 17, to a metal interconnect 18a through which input A is fed, and the gate interconnect 14 is connected, via the corresponding local interconnect 16 and contact 17, to a metal interconnect 18b through which input B is fed. A metal interconnect 18c through which output Y is output is connected to portions of the fins 11 between the gate interconnects 13 and 14 and to the other ends of the fins 12 (ends on the right side as viewed from the figure) via the corresponding local interconnects 16 and contacts 17.

The standard cell 2 includes gate interconnects 23, 24, 25, and 26 extending in the Y direction over the p-type transistor area PA and the n-type transistor area NA. In the p-type transistor area PA, the fins 21a and the gate interconnect 23 constitute a fin FET P21, and the fins 21a and the gate interconnect 24 constitute a fin FET P22. The fin FETs P21 and P22 share the source, which is connected to the power supply interconnect VDD via a corresponding local interconnect 31 extending in the Y direction and a corresponding contact 28. Also, the fins 21b and the gate interconnect 25 constitute a fin FET P23, and the fins 21b and the gate interconnect 26 constitute a fin FET P24. The fin FETs P23 and P24 share the source, which is connected to the power supply interconnect VDD via a corresponding local interconnect 31 extending in the Y direction and a corresponding contact 28.

In the n-type transistor area NA, the fins 22a and the gate interconnect 23 constitute a fin FET N21, and the fins 22a and the gate interconnect 24 constitute a fin FET N22. The fin FETs N21 and N22 share the source, which is connected to the power supply interconnect VSS via a corresponding local interconnect 31 extending in the Y direction and a corresponding contact 28. Also, the fins 22b and the gate interconnect 25 constitute a fin FET N23, and the fins 22b and the gate interconnect 26 constitute a fin FET N24. The fin FETs N23 and N24 share the source, which is connected to the power supply interconnect VSS via a corresponding local interconnect 31 extending in the Y direction and a corresponding contact 28.

Dummy gate interconnects 27a, 27b, and 27c are also provided. The dummy gate interconnect 27c extends in the Y direction between the fins 21a and 21b and between the fins 22a and 22b. The dummy gate interconnect 27c runs keeping away from the fins 21a, 21b, 22a, and 22b.

The standard cell 2 also includes metal interconnects 29a to 29e. The metal interconnect 29a is connected to the gate interconnect 23. That is, the metal interconnect 29a is connected to the gates of the fin FETs P21 and N21 and corresponds to input C of the standard cell 2. The metal interconnect 29b connects ends of the fins 21a and 22a (ends on the left side as viewed from the figure) to the gate interconnect 24. That is, the metal interconnect 29b connects the drains of the fin FETs P21 and N21 and the gates of the fin FETs P22 and N22. The metal interconnect 29c connects the other ends of the fins 21a and 22a (ends on the right side as viewed from the figure) to the gate interconnect 25. That is, the metal interconnect 29c connects the drains of the fin FETs P22 and N22 and the gates of the fin FETs P23 and N23. The metal interconnect 29d connects ends of the fins 21b and 22b (ends on the left side as viewed from the figure) to the gate interconnect 26. That is, the metal interconnect 29d connects the drains of the fin FETs P23 and N23 and the gates of the fin FETs P24 and N24. The metal interconnect 29e connects the other ends of the fins 21b (ends on the right side as viewed from the figure) and the other ends of the fins 22b (ends on the right side as viewed from the figure). That is, the metal interconnect 29e connects the drains of the fin FETs P24 and N24 together and corresponds to output Z of the standard cell 2.

Attention will now be focused on the local interconnects that connect the fins and the power supply interconnects.

In the p-type transistor area PA of the standard cell 2, the local interconnects 31 that are connected to the fins 21a and 21b and extend in the Y direction further extend, beyond the fins 21a and 21b, long toward the inside of the cell. That is, the distance (protrusion length) D2 by which the local interconnects 31 protrude from the fins 21a and 21b in the direction away from the power supply interconnect VDD is greater than the distance (protrusion length) D1 by which the local interconnects 16 protrude from the fins 11 in the direction away from the power supply interconnect VDD in the p-type transistor area PA of the standard cell 1. Similarly, in the n-type transistor area NA of the standard cell 2, the local interconnects 31 that are connected to the fins 22a and 22b and extend in the Y direction further extend, beyond the fins 22a and 22b, long toward the inside of the cell.

In a normal standard cell, the length of a local interconnect is set to a minimum to restrain the increase of the parasitic capacitance. For example, the protrusion length D1 of the local interconnects 16 in the standard cell 1 is preferably the minimum value allowable in the manufacturing process. In this embodiment, however, in the standard cell 2 that is a delay cell, the local interconnects 31 are further extended, beyond the fins 21a, 21b, 22a, and 22b, long toward the inside of the cell, for the purpose of increasing the interconnect capacitance thereby making the delay larger. By extending the local interconnects 31 longer, the parasitic capacitance between the local interconnects 31 and the gate interconnects 23, 24, 25, and 26 becomes larger, so that the delay value can be made large. In this way, a delay cell, i.e., the standard cell 2, having a large delay value per unit area can be implemented.

In the configuration of FIG. 1, the numbers of the fins 11 and the fins 21a and 21b, and the positions of these fins in the Y direction, are assumed to be the same. However, the present disclosure is not limited to this, but the numbers of the fins 11 and the fins 21a and 21b may be different from each other, and the positions thereof in the Y direction are not necessarily the same. In either case, the lengths of the protrusion of the local interconnects from the innermost sides of the fins may be used as the protrusion lengths for comparison.

Also, in the configuration of FIG. 1, the standard cells 1 and 2 are assumed to be placed in the same cell row extending in the X direction. However, the present disclosure is not limited to this, but they may be placed in difference cell rows.

Figure 4A:
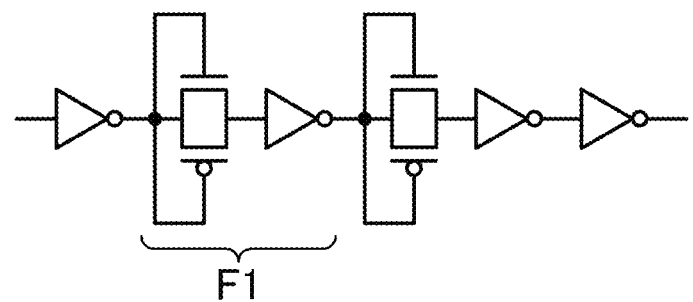
FIGS. 4A and 4B are other circuit examples of the delay cell.
Figure 4B:
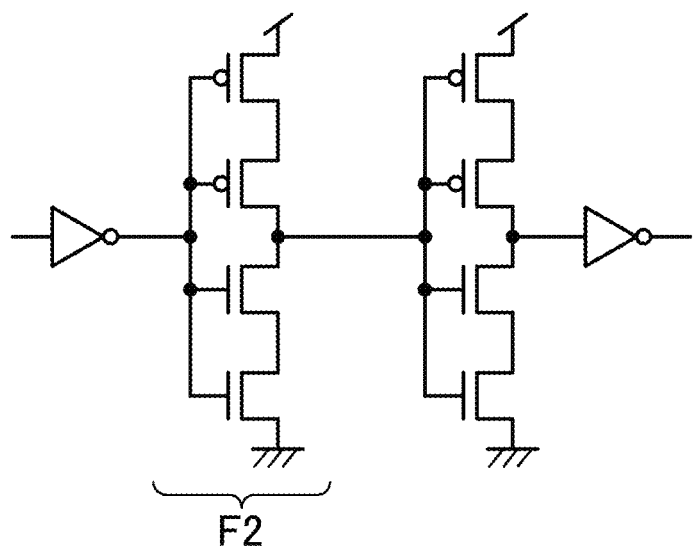

The circuit configuration of the delay cell is not limited to one shown in FIG. 3B. For example, the number of serially-connected inverters may be two or six, not four. Otherwise, circuit configurations as shown in FIGS. 4A and 4B may be used. In FIG. 4A, inverters and switch circuits each made of a set of a p-type transistor and an n-type transistor are connected in series. While two partial circuits F1 each made of a switch circuit and an inverter are connected in FIG. 4A, N partial circuits F1 (N is an even number) may be connected. Also, two or more switch circuits may be connected in series. In FIG. 4B, a partial circuit F2 is constituted by an inverter made of two each of p-type transistors and n-type transistors in cascade connection. While two partial circuits F2 are connected in FIG. 4B, N partial circuits F2 (N is an even number) may be connected. Also, the inverter constituting the partial circuit F2 may be made of three or more each of p-type transistors and n-type transistors in cascade connection. That is, the delay cell may have any circuit configuration as long as it delays the input signal and outputs the delayed signal.

(Geometries of Metal Interconnects)

Figure 5:
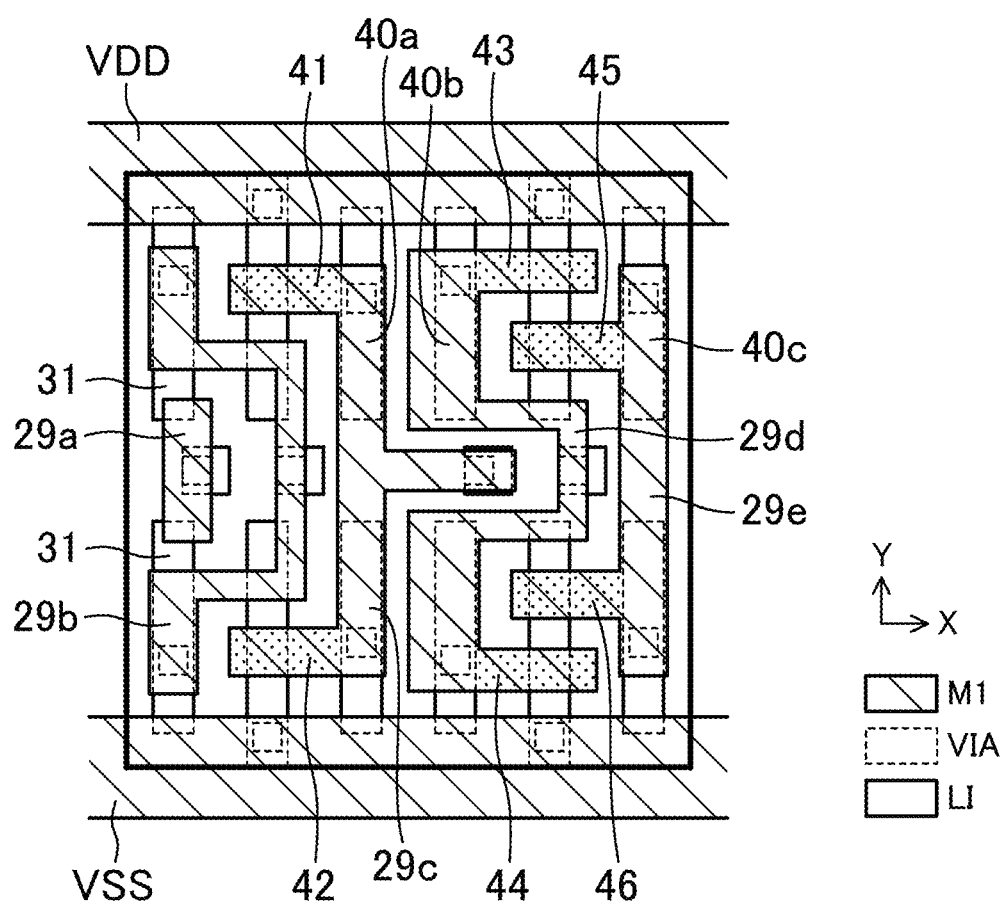
FIG. 5 is a plan view showing the geometries of metal interconnects in the standard cell 2 in FIG. 1.

FIG. 5 is a plan view showing the geometries of the metal interconnects in the standard cell 2 in FIG. 1. Note that in FIG. 5 the fins and the gate interconnects are omitted for the sake of simplification of the drawing. As described earlier, the standard cell 2 includes the metal interconnects 29a to 29e, by which the connection for constructing the logic of the standard cell 2 is performed.

In this embodiment, the metal interconnects that perform the connection for constructing the logic of the standard cell 2 additionally have redundant portions (dot-patterned portions in FIG. 5) unnecessary for merely the construction of the logic. Having these redundant portions, the interconnect capacitance of the signal interconnects is increased, whereby the delay can be made larger.

To state specifically, the metal interconnect 29c has a main portion 40a and redundant portions 41 and 42. The main portion 40a (portion of the metal interconnect 29c having no dot pattern) performs the connection for constructing the logic of the standard cell 2, and specifically connects the drains of the fin FETs P22 and N22 and the gates of the fin FETs P23 and N23. The redundant portions 41 and 42 branch from the main portion 40a in a direction (X direction in this case) different from the direction in which the main portion 40a extends (Y direction in this case), and are electrically connected only to the main portion 40a.

Similarly, the metal interconnect 29d has a main portion 40b and redundant portions 43 and 44. The main portion 40b (portion of the metal interconnect 29d having no dot pattern) performs the connection for constructing the logic of the standard cell 2, and specifically connects the drains of the fin FETs P23 and N23 and the gates of the fin FETs P24 and N24. The redundant portions 43 and 44 branch from the main portion 40b in a direction (X direction in this case) different from the direction in which the main portion 40b extends (Y direction in this case), and are electrically connected only to the main portion 40b. The metal interconnect 29e has a main portion 40c and redundant portions 45 and 46. The main portion 40c (portion of the metal interconnect 29e having no dot pattern) performs the connection for constructing the logic of the standard cell 2, and specifically connects the drains of the fin FETs P24 and N24 together. The redundant portions 45 and 46 branch from the main portion 40c in a direction (X direction in this case) different from the direction in which the main portion 40c extends (Y direction in this case), and are electrically connected only to the main portion 40c.

Figure 6:
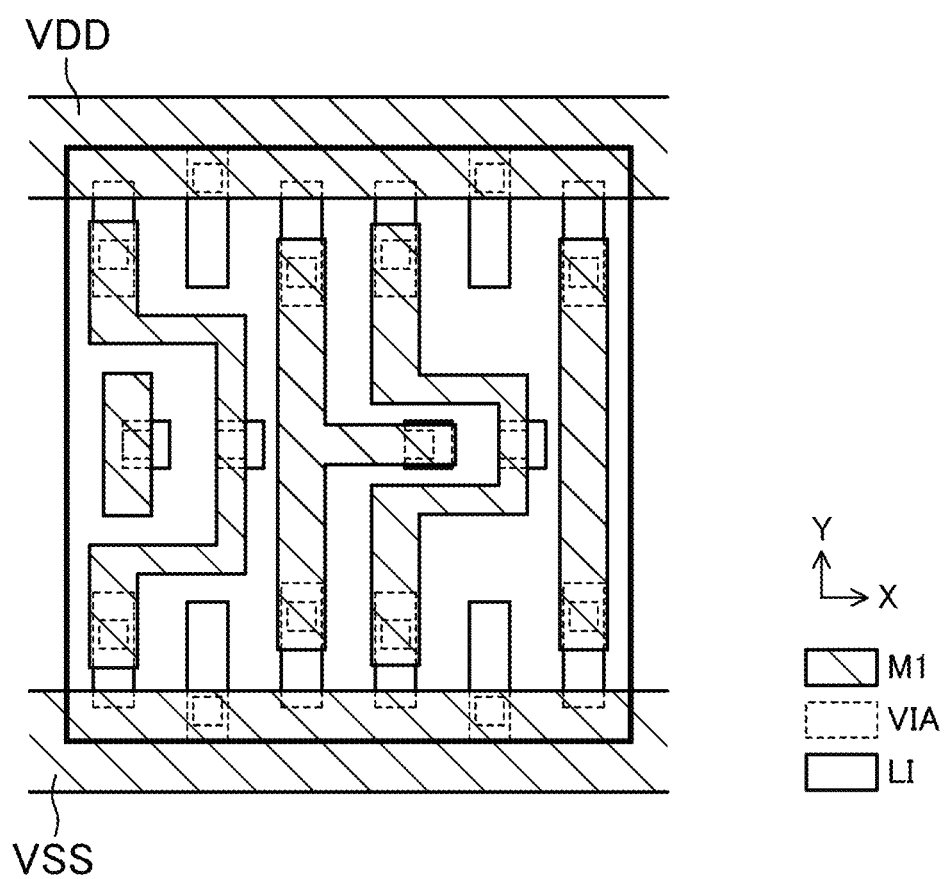
FIG. 6 is a plan view showing a comparative example to FIG. 5.

FIG. 6 is a view showing, as a comparative example, a layout configuration of the standard cell 2 in which the redundant portions are omitted from the metal interconnects. As is found from FIG. 6, no problem will arise in constructing the logic of the standard cell 2 when the redundant portions 41 to 46 are omitted from the layout of FIG. 5.

As described above, by providing, for the metal interconnects 29c, 29d, and 29e that perform the connection for constructing the logic of the standard cell 2, the redundant portions 41 to 46 unnecessary for merely the construction of the logic, the interconnect capacitance of the signal interconnects is increased, whereby the delay can be made larger.

In the configuration of FIG. 5, the redundant portion 43 of the metal interconnect 29d corresponding to the first interconnect and the redundant portion 45 of the metal interconnect 29e corresponding to the second interconnect extend in the same direction (X direction in this case) and are adjacent to each other without any other metal interconnect interposed therebetween in the direction vertical to the same direction (Y direction in this case). Similarly, the redundant portion 44 of the metal interconnect 29d and the redundant portion 46 of the metal interconnect 29e extend in the same direction (X direction in this case) and are adjacent to each other without any other metal interconnect interposed therebetween in the direction vertical to the same direction (Y direction in this case). Having such a configuration, the interconnect capacitance of the signal interconnects can be further increased, whereby the delay can be made larger.

Moreover, as for the inverter constituted by the fin FETs P24 and N24, the metal interconnect 29d is connected to the input of this inverter, and the metal interconnect 29e is connected to the output of the inverter. In such metal interconnects 29d and 29e serving as the signal lines for the input and output of the same inverter, by placing the redundant portions 43 and 45 to be adjacent to each other and the redundant portions 44 and 46 to be adjacent to each other, the delay of the signal interconnects can be made larger. Note that, for a logic gate other than inverters, redundant portions of metal interconnects serving as the signal lines for the input and output of the logic gate may be placed to be adjacent to each other.

(Alterations)

Figure 7:
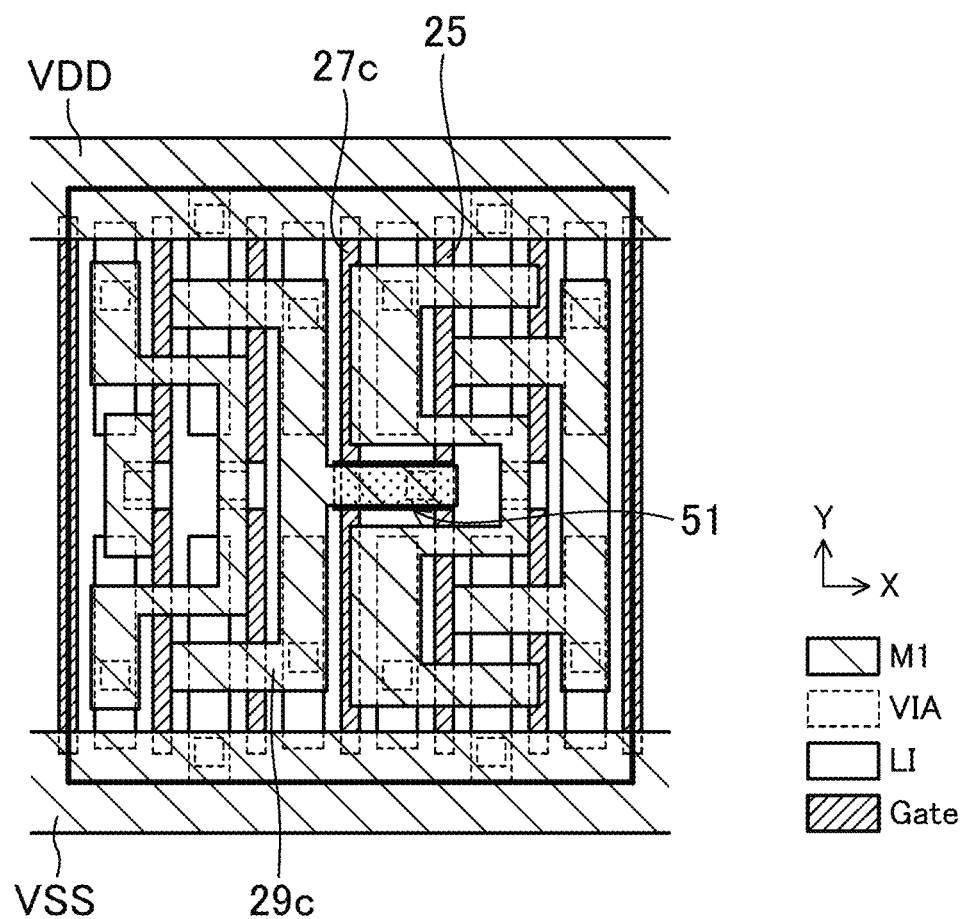
FIG. 7 is a plan view showing an alteration of the standard cell 2 in FIG. 1.

FIG. 7 is a view showing an alteration of the layout configuration of the standard cell 2 in FIG. 1. Note that in FIG. 7 the fins are omitted for the sake of simplification of the drawing. In the configuration of FIG. 7, the dummy gate interconnect 27c is connected to the gate interconnect 25 and the metal interconnect 29c via a local interconnect 51 (dot-patterned). That is, the dummy gate interconnect 27c is connected to the signal interconnect for connecting the inverter constituted by the fin FETs P22 and N22 and the inverter constituted by the fin FETs P23 and N23 so as to constitute a capacitance. Thus, the interconnect capacitance of the signal interconnects is increased, whereby the delay can be made larger.

Figure 8:
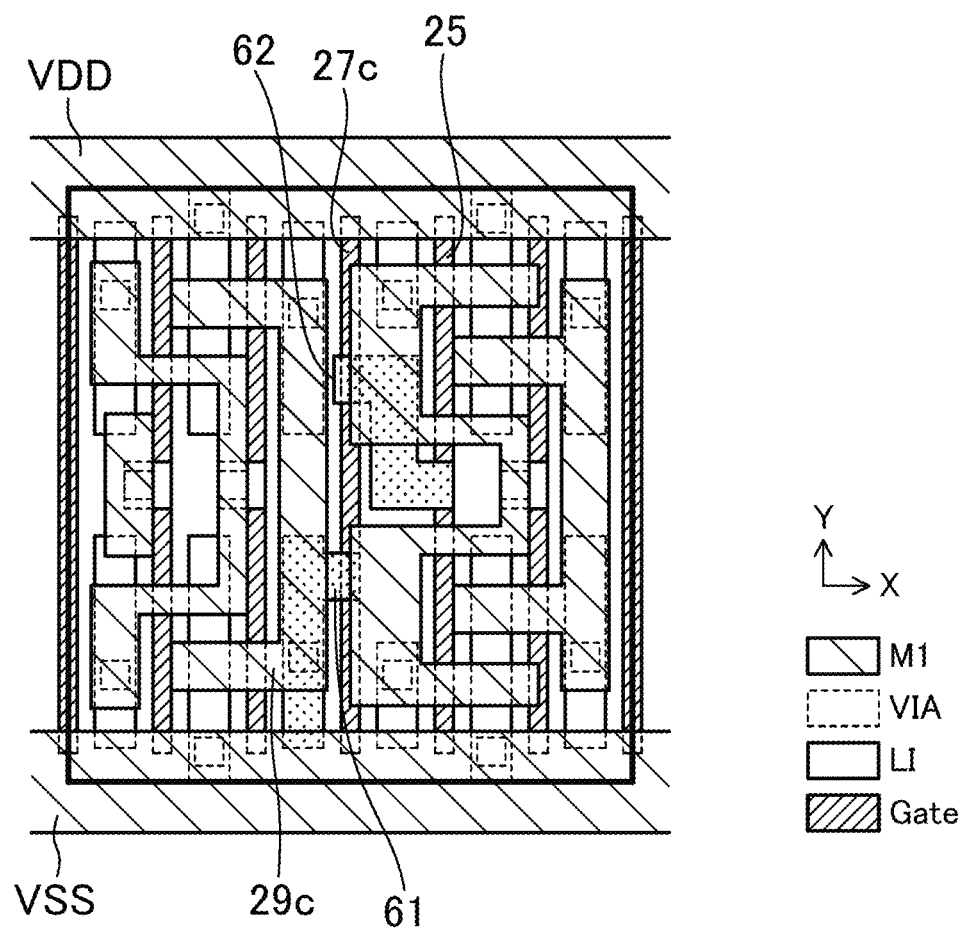
FIG. 8 is a plan view showing another alteration of the standard cell 2 in FIG. 1.
Figure 9:
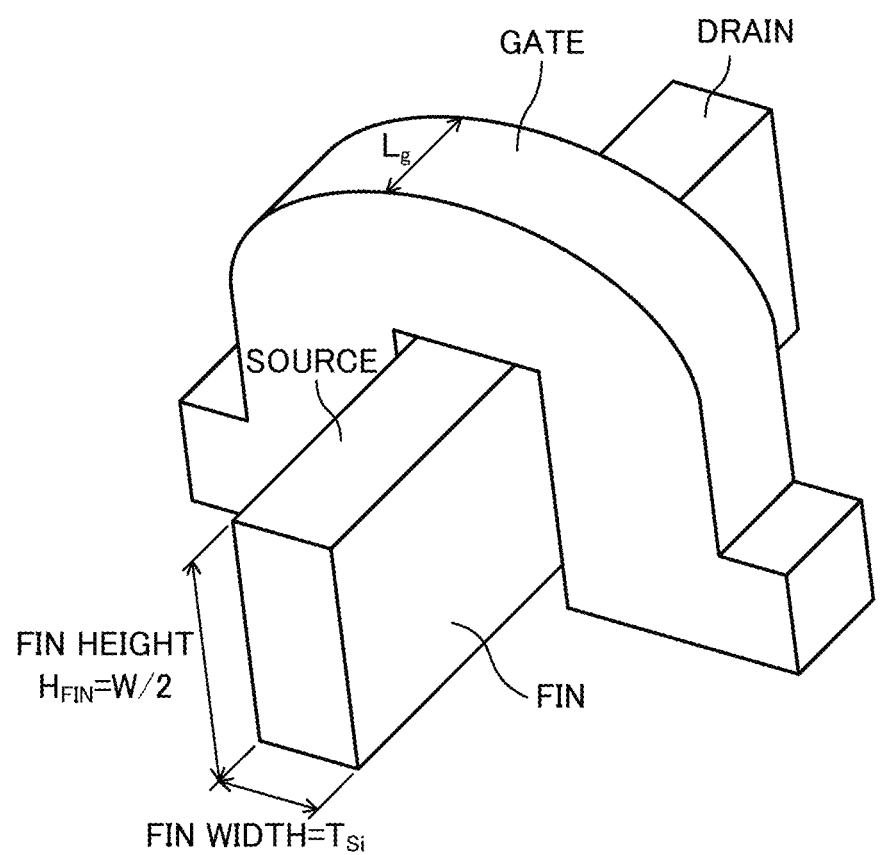
FIG. 9 is a diagrammatic view showing an outline structure of a fin FET.

FIG. 8 is a view showing another alteration of the layout configuration of the standard cell 2 in FIG. 1. Note that in FIG. 8 the fins are omitted for the sake of simplification of the drawing. In the configuration of FIG. 8, the dummy gate interconnect 27c is connected to the metal interconnect 29c via a local interconnect 61 (dot-patterned) and connected to the gate interconnect 25 via a local interconnect 62 (dot-patterned). That is, the dummy gate interconnect 27c is connected so as to constitute part of the signal interconnect for connecting the inverter constituted by the fin FETs P22 and N22 and the inverter constituted by the fin FETs P23 and N23. Thus, the dummy gate interconnect 27c contributes to both the delay and interconnect capacitance of the signal interconnects, whereby the delay of the signal interconnects can be made larger.

(Other Examples of Three-Dimensional Transistor Devices)

While the fin FETs were taken as an example in the above embodiments, three-dimensional transistor devices other than fin FETs, e.g. nanowire FETs, may be used.

Figure 10:
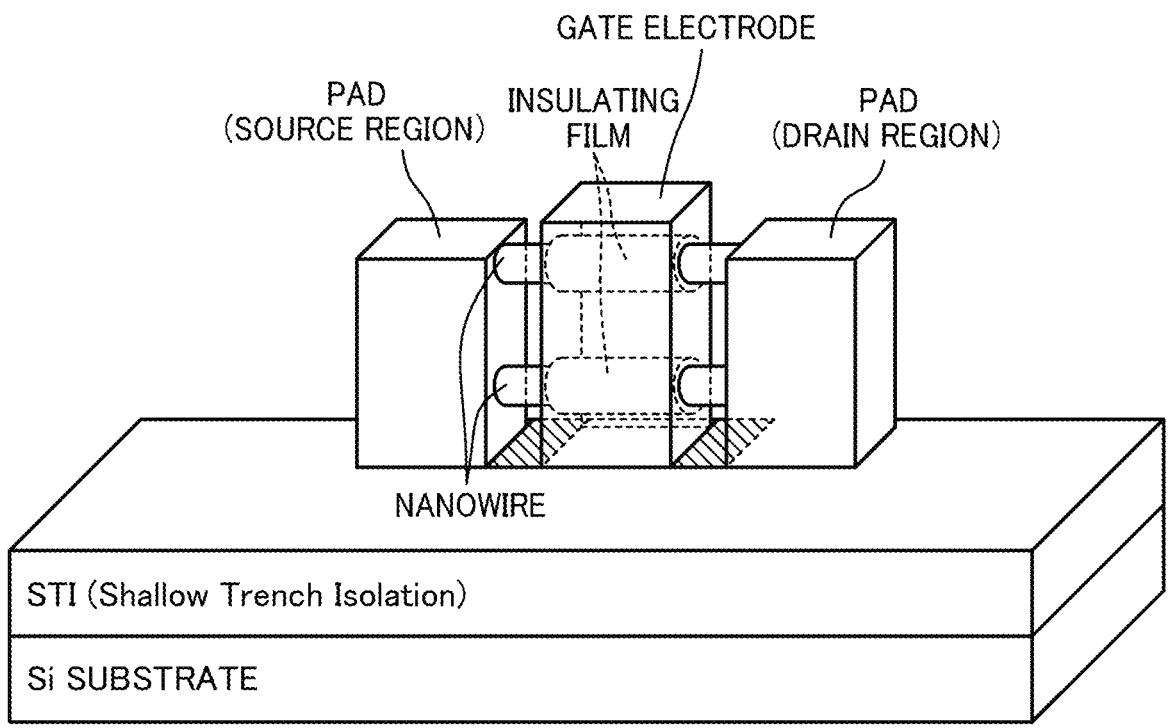
FIG. 10 is a diagrammatic view showing an outline structure of a nanowire FET.

FIG. 10 is a diagrammatic view showing an example of a basic structure of a nanowire FET (also referred to as a gate all around (GAA) structure). The nanowire FET is a FET using fine wires (nanowires) through which a current flows. The nanowires are formed of silicon, for example. As shown in FIG. 10, the nanowires are formed to extend above a substrate in the horizontal direction, i.e., in parallel with the substrate, and connected, at both ends, to structures that are to be a source region and drain region of the nanowire FET. As used herein, the structures that are connected to both ends of the nanowires and are to be the source region and drain region of the nanowire FET are referred to as the pads. In FIG. 10, while shallow trench isolation (STI) is formed on the silicon substrate, the silicon substrate is exposed in portions below the nanowires (hatched portions). Actually, the hatched portions may be covered with a thermally-oxidized film, etc. Illustration of such a film is however omitted in FIG. 10 for the sake of simplification.

The nanowires are surrounded by a gate electrode made of polysilicon, for example, via insulating films such as silicon oxide films. The pads and the gate electrode are formed on the surface of the substrate. With this structure, since the channel regions of the nanowires are covered with the gate electrode in all of their top portions, side portions, and bottom portions, the electric field will be applied uniformly over the channel regions, thereby improving the switching characteristics of the FET.

Note that, while at least the portions of the pads to which the nanowires are connected serve as the source/drain regions, portions thereof lower than the nanowire-connected portions may not necessarily serve as the source/drain regions. Also, part of the nanowires (portions that are not surrounded by the gate electrode) may serve as the source/drain regions.

In FIG. 10, two nanowires are placed in the vertical direction, i.e. in the direction perpendicular to the substrate. The number of nanowires placed in the vertical direction is not limited to two, but it may be one. Otherwise, three or more nanowires may be placed side by side in the vertical direction. Also, in FIG. 10, the top of the upper nanowire and the tops of the pads are in line with each other. However, it is unnecessary to align the positions of the tops, but the tops of the pads may be located higher than the top of the upper nanowire.

Figure 11:
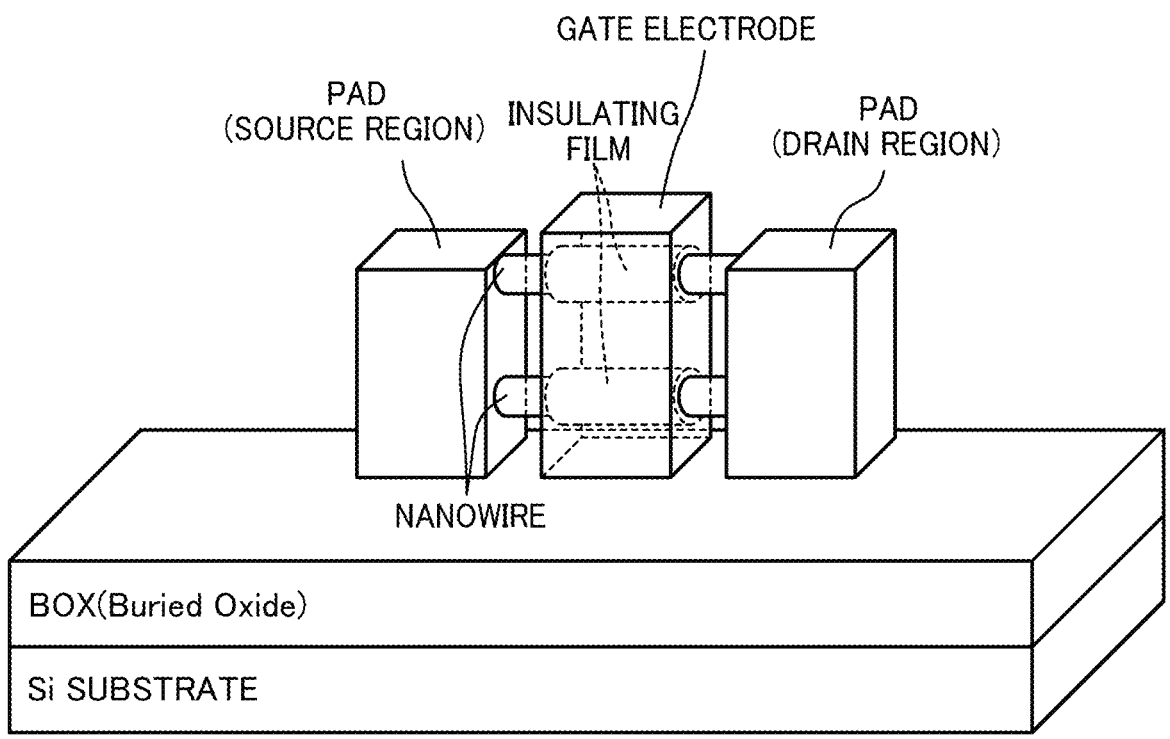
FIG. 11 is a diagrammatic view showing an outline structure of another nanowire FET.

Also, as shown in FIG. 11, buried oxide (BOX) may be formed on the top surface of the substrate, and the nanowire FET may be formed on this BOX.

When a semiconductor integrated circuit device is implemented using the nanowire FETs in place of the fin FETs in the above embodiments, one nanowire, or a plurality of nanowires placed in the direction perpendicular to the substrate, and the pads connected to both ends of the nanowire or nanowires correspond to the fin of the fin FET. For example, each of the two fins 21a of the standard cell 2 in FIG. 1 is replaced with a structure in which nanowire portions each made of one nanowire, or a plurality of nanowires placed in the direction perpendicular to the substrate, extending in the X direction and the pads are connected alternately. That is, in the structure using the nanowire FET, a nanowire and pads connected to both ends thereof correspond to the solid diffusion layer portion. Local interconnects are connected to the pads in the structure corresponding to the solid diffusion layer portion.

The components in the embodiments may be combined arbitrarily within the bounds of the spirit of the invention.

According to the present disclosure, in a semiconductor integrated circuit device using three-dimensional transistor devices, a delay cell having a large delay value per unit area can be implemented. Therefore, the present disclosure is useful for improvement of the performance of the semiconductor integrated circuit device.

What is claimed is:

1. A semiconductor integrated circuit device, comprising:
   a first standard cell, which is a logic cell, having three-dimensional transistor devices; and
   a second standard cell, which is a delay cell, having three-dimensional transistor devices,
   wherein the first standard cell includes:
      a plurality of first solid diffusion layer portions extending in a first direction, the plurality of first solid diffusion layer portions being arranged in a second direction vertical to the first direction, and
      a first local interconnect extending in the second direction and connecting the plurality of first solid diffusion layer portions and a power supply interconnect that extends in the first direction and feeds a predetermined first power supply voltage,
   the second standard cell includes:
      a plurality of second solid diffusion layer portions extending in the first direction, the plurality of second solid diffusion layer portions being arranged in the second direction,
      a second local interconnect extending in the second direction and connecting the plurality of second solid diffusion layer portions and the power supply interconnect, and
      a gate interconnect extending in the second direction to intersect with the plurality of second solid diffusion layer portions as viewed from top, formed to surround the plurality of second solid diffusion layer portions, a signal being applied to the gate interconnect, and
   a length by which the second local interconnect protrudes from the plurality of second solid diffusion layer portions in a direction away from the power supply interconnect in the second standard cell is greater than a length by which the first local interconnect protrudes from the plurality of first solid diffusion layer portions in a direction away from the power supply interconnect in the first standard cell,
   wherein the second standard cell further includes:
   a first interconnect formed above the second local interconnect, and the first interconnect includes:
      a main portion utilized for constructing logic of the second standard cell, and
      a redundant portion, branching from the main portion in a direction different from a direction in which the main portion extends, electrically connected only to the main portion.

2. The semiconductor integrated circuit device of claim 1, wherein the plurality of first solid diffusion layer portions and the plurality of second solid diffusion layer portions are aligned along the first direction.

3. The semiconductor integrated circuit device of claim 1, wherein
   the second standard cell further includes a second interconnect having a main portion and a redundant portion,
   the redundant portion of the first interconnect and the redundant portion of the second interconnect extend in the same direction and are adjacent to each other without any other metal interconnect interposed therebetween in a direction vertical to the same direction.

4. The semiconductor integrated circuit device of claim 3, wherein
   the second standard cell further includes:
      a logic gate constituted by a three-dimensional transistor device,
   the first interconnect is connected to an input of the logic gate, and
   the second interconnect is connected to an output of the logic gate.

5. The semiconductor integrated circuit device of claim 4, wherein the logic gate is an inverter.

6. The semiconductor integrated circuit device of claim 1, wherein
   the second standard cell further includes:
      a dummy gate interconnect extending in the second direction, provided to be apart from the plurality of second solid diffusion layer portions, and
   the dummy gate interconnect is connected to an interconnect that is used for constructing logic of the second standard cell.

7. The semiconductor integrated circuit device of claim 1, wherein the second standard cell further includes a dummy gate interconnect that constitutes a part of a signal interconnect used for constructing logic of the second standard cell.

8. The semiconductor integrated circuit device of claim 1, wherein the three-dimensional transistor devices are fin field effect transistors (FETs) or nanowire FETs.

9. A semiconductor integrated circuit device, comprising:
   a first standard cell, which is a logic cell, having three-dimensional transistor devices; and
   a second standard cell, which is a delay cell, having three-dimensional transistor devices,
   wherein the first standard cell includes:
      a plurality of first solid diffusion layer portions extending in a first direction, the plurality of first solid diffusion layer portions being arranged in a second direction vertical to the first direction, and
      a first local interconnect extending in the second direction and connecting all the plurality of first solid diffusion layer portions and a power supply interconnect that extends in the first direction and feeds a predetermined first power supply voltage,
   the second standard cell includes:
      a plurality of second solid diffusion layer portions extending in the first direction, the plurality of second solid diffusion layer portions being arranged in the second direction,
      a second local interconnect extending in the second direction and connecting all the plurality of second solid diffusion layer portions and the power supply interconnect, and
      a gate interconnect extending in the second direction to intersect with the plurality of second solid diffusion layer portions as viewed from top, formed to surround the plurality of second solid diffusion layer portions, a signal being applied to the gate interconnect, and a length by which the second local interconnect protrudes from one of the plurality of second solid diffusion layer portions in a direction away from the power supply interconnect in the second standard cell, the one of the plurality of second solid diffusion layer portions having most distance from the power supply interconnect among the plurality of second solid diffusion layer portions, is greater than a length by which the first local interconnect protrudes from one of the plurality of first solid diffusion layer portions in a direction away from the power supply interconnect in the first standard cell, the one of the plurality of first solid diffusion layer portions having most distance from the power supply interconnect among the plurality of first solid diffusion layer portions.

10. The semiconductor integrated circuit device of claim 9, wherein the plurality of first solid diffusion layer portions and the plurality of second solid diffusion layer portions are aligned along the first direction.

11. The semiconductor integrated circuit device of claim 9, wherein the second standard cell further includes:

a first interconnect formed above the second local interconnect, and the first interconnect includes:

a main portion utilized for constructing logic of the second standard cell, and a redundant portion, branching from the main portion in a direction different from a direction in which the main portion extends, electrically connected only to the main portion.

12. The semiconductor integrated circuit device of claim 11, wherein the second standard cell further includes a second interconnect having a main portion and a redundant portion, the redundant portion of the first interconnect and the redundant portion of the second interconnect extend in the same direction and are adjacent to each other without any other metal interconnect interposed therebetween in a direction vertical to the same direction.

13. The semiconductor integrated circuit device of claim 12, wherein the second standard cell further includes:

a logic gate constituted by a three-dimensional transistor device, the first interconnect is connected to an input of the logic gate, and the second interconnect is connected to an output of the logic gate.

14. The semiconductor integrated circuit device of claim 13, wherein the logic gate is an inverter.

15. The semiconductor integrated circuit device of claim 9, wherein the second standard cell further includes:

a dummy gate interconnect extending in the second direction, provided to be apart from the plurality of second solid diffusion layer portions, and the dummy gate interconnect is connected to an interconnect that is used for constructing logic of the second standard cell.

16. The semiconductor integrated circuit device of claim 9, wherein the second standard cell further includes a dummy gate interconnect that constitutes a part of a signal interconnect used for constructing logic of the second standard cell.

17. The semiconductor integrated circuit device of claim 9, wherein the three-dimensional transistor devices are fin field effect transistors (FETs) or nanowire FETs.

* * * * *